United States Patent [19]

Zeblisky

[11] 4,391,841

[45] Jul. 5, 1983

[54] PASSIVATION OF METALLIC EQUIPMENT SURFACES IN ELECTROLESS COPPER DEPOSITION PROCESSES

[75] Inventor: Rudolph J. Zeblisky, Hauppauge, N.Y.

[73] Assignee: Kollmorgen Technologies Corporation, Dallas, Tex.

[21] Appl. No.: 344,801

[22] Filed: Feb. 1, 1982

Related U.S. Application Data

[63] Continuation of Ser. No. 130,451, Mar. 28, 1980, abandoned, which is a continuation-in-part of Ser. No. 34,812, Apr. 30, 1979, abandoned.

[51] Int. Cl.³ .............................................. C23C 3/02
[52] U.S. Cl. ..................................... 427/12; 118/70; 204/147; 204/196; 427/98; 427/437; 427/443.1
[58] Field of Search ................ 204/196, 147; 427/437, 427/438, 443.1, 12, 98; 118/70

[56] References Cited

U.S. PATENT DOCUMENTS

| | | | |
|---|---|---|---|
| 2,921,005 | 1/1960 | Bodamer | 204/180 P |
| 3,208,925 | 9/1965 | Hutchison et al. | 204/196 |
| 3,347,768 | 10/1967 | Clark et al. | 204/196 |
| 3,424,660 | 1/1969 | Klein | 204/147 |
| 3,437,572 | 4/1969 | Banks et al. | 204/196 |
| 3,903,319 | 9/1975 | El-Mohamad | 204/147 |
| 4,125,642 | 11/1978 | Petit et al. | 427/8 |

FOREIGN PATENT DOCUMENTS 2639247  2/1978  Fed. Rep. of Germany .

*Primary Examiner*—John D. Smith
*Attorney, Agent, or Firm*—Morgan, Finnegan, Pine, Foley & Lee

[57] ABSTRACT

The metallic surfaces of plating equipment in use during electroless copper deposition, such as vessels, racks supporting substrates being plated, plumbing, and the like are rendered substantially resistant to electroless copper deposition for extended periods by initially imposing on such equipment surfaces an electrical potential more positive than the mixed potential of the electroless copper solution and sufficiently positive to resist electroless deposition, electrolessly depositing copper on the substrate being plated, and while depositing such copper maintaining on the equipment surface a potential sufficiently positive to resist the formation of adherent electroless copper deposits.

25 Claims, 4 Drawing Figures

PASSIVATION OF METALLIC EQUIPMENT SURFACES IN ELECTROLESS COPPER DEPOSITION PROCESSES

This is a continuation, of application Ser. No. 130,451 filed Mar. 28, 1980 abandoned which is in turn, a continuation-in-part of application Ser. No. 34,812, filed Apr. 30, 1979 abandoned.

BACKGROUND OF THE ART

Electroless metal deposition baths, e.g., electroless copper solutions, are known in the art as useful for providing metal deposits on non-metallic and metallic surfaces. Such solutions are characterized by the capacity to deposit or plate metal in virtually any desired thickness without the need for supplying electrons from an external source of current. After an electroless metal deposit is formed on the surface of the article, the electroless solution becomes autocatalytic, i.e., continues to deposit metal so long as the solution is replenished and maintained.

Special mention is made of the use of electroless metallizing procedures in the plating of plastics generally, and in the manufacture of printed circuit boards particularly. In the plating of plastics, copper is electrolessly deposited on the surface of an article to produce a metallized plastic article for use, e.g., in the auto industry as grills or decorative stripping, in the toy industry as metallized plastic miniatures, and in home products as door knobs and the like.

In the manufacture of printed circuit boards, in one type of procedure a metallic or sensitized non-metallic substratum is provided with copper foil or a thin layer of electrolessly deposited copper. Selected areas of the copper corresponding to the desired circuit pattern are then masked. The unmasked copper is then build up, as by electroplating. The masking material is removed from the copper. The thin layer of background copper is next etched away. In another type of procedure, the surface of the substratum is sensitized for electroless deposition, areas not corresponding to the circuit pattern are masked, and copper is deposited on the unmasked sensitized areas by electroless and/or electroplating techniques until the desired copper thickness is attained.

When electroless plating operations of the foregoing type are practiced on a commercial scale, typically, large plating vessels are employed. The parts or articles to be plated are immersed in the electroless copper deposition solution in the plating vessel. The parts or articles are, moreover, supported on racks or frames immersed in the deposition solution. It has been found, in practice, that if the plating vessel and support racks are constructed of a non-metal, e.g., plastic or glass, copper particles forming in the electroless copper solution during the electroless plating reaction become attached to such equipment surfaces. The attached copper particles provide sites for further electroless copper deposition and growth. If this phenomenon is permitted to proceed unimpeded, eventually most or substantially all of such equipment surfaces become covered with a deposit of electroless copper. This weakens the deposition solution. Furthermore, the plating operation must be interrupted to empty the tank and etch away the copper from the non-metallic equipment surfaces. This etching procedure, though necessary to recapture the copper and avoid waste, is nevertheless disadvantageous in that the plating operation must be stopped, etching chemicals must be stored and handled, etc., and large amounts of expensive etching chemicals are often required. Thus, additional costs are imposed due to interruptions in the plating operation, and because of the labor involved in the etching process. A further disadvantage is that this etching weakens the structure of the non-metallic plating vessels, racks, etc. and shortens their useful life.

The use of plating vessels and other plating equipment made of metallic material is desirable because of greater durability and normally greater availability. These are nevertheless subject to many of the same disadvantages just described. Specifically, copper deposits form continuously and catalytically on the metallic equipment surfaces in contact with the electroless deposition solution, and plating occurs even faster than in those cases where non-metallic equipment is employed. This problem is particularly acute where adjustable metal racks, i.e., containing metal fasteners, are used because the fasteners become coated with an electroless metal deposit making difficult their release.

It is known in the art that plating vessels made of metallic retaining walls, as well as other metallic plating equipment such as racks, plumbing and the like, can be rendered temporarily resistant to electroless metal deposition by pretreatment with chemicals, e.g., nitric acid solutions. Such chemical treatments tend to wear off within hours of operation, however. Consequently, the plating procedure must be interrupted to empty the plating vessel and renew the chemical treatment.

Klein et al., in U.S. Pat. No. 3,424,660, disclose that plating vessels having metallic retaining walls can be protected against electroless metal deposition, particularly electroless nickel, by imposing a potential thereon at a value corresponding to the rest potential or the protection potential range on the current density/potential curve. The current density is adjusted to not more than about $10^{-4}$ amperes per square centimeter.

German Offenlegungsschrift No. 2639247 discloses that plating tanks and racks made of a metal such as cobalt or nickel can be rendered resistant to electroless metal deposition, such as electroless copper deposition, by charging with a current density of at least 4 milliamperes per square decimeter.

It has also been proposed, in Japan Patent Publication No. 54-36577, dated Nov. 9, 1979, that a metal plating vessel, such as of chromium-nickel steel, can be rendered resistant to chemical plating if a positive electrical potential is applied to the plating vessel surface during the plating operation.

In commercial practice, procedures such as the foregoing have not proved satisfactory when applied to electroless copper plating processes. As the electroless copper deposition reaction proceeds, plating chemicals in the solution must be replenished. The chemical replenishment usually causes local fluctuations in the concentrations of chemicals and the introduction of impurities into the solution. Then too, dirt or dust gradually accumulates in the deposition solution. As a result, discrete particles of precipitated copper form in the deposition solution and come into contact with the equipment surfaces. Such copper precipitates draw high current through the metallic plating equipment in prior art processes, causing the electrical potential imposed on such equipment to decay and fall below that needed to resist electroless deposits. An equivalent area of metallic copper requires at least two orders of magnitude more current than stainless steel to resist electroless copper deposition. Thus, although the equipment surfaces in prior art processes are resistant to electroless deposition during the initial stages of the plating operation, when attempts are made to operate such prior art processes on a commercial scale, with replenishment and unavoidable copper precipitation from the bulk solution, after a brief period the equipment surfaces lose their resistance. Thus, prior art procedures have not been successfully adapted to commercial use.

An additional problem is often encountered in the manufacture of printed circuit boards, in particular. In such manufacturing procedures, sometimes layers of copper which are not part of the circuit pattern itself are formed on the borders of the insulating substratum. If such copper borders contact the metal racks supporting the substratum, the current is drastically increased, thus diminishing or decaying the electrical potential applied to the rack such that it eventually falls below the minimum potential required to avoid plating. The prior art procedures have failed to avoid this problem also. The potentiostats of the prior art processes are capable of maximum currents of no greater than one ampere, indicating a lack of knowledge or understanding of the problems encountered in plating on a larger scale, such as in commercial operations.

It is an object of this invention to provide a process for electroless copper deposition in which metallic plating equipment in contact with the deposition solution is rendered initially resistant to electroless copper deposits and maintained in a resistant state for extended periods of the plating operation.

It is another object of this invention to enable use in commercial scale deposition processes of metallic plating equipment for longer periods without the build-up of copper deposits which must be removed by etching.

It is another object of this invention to provide electroless copper deposition processes in which copper precipitates in contact with the plating equipment can be easily removed, as by brushing, sweeping, vacuuming, and the like, without the stopping or shutting down of the plating operation.

It is another object of this invention to provide improved methods of printed circuit board manufacture in which adherent electroless copper deposits on equipment surfaces are avoided.

It is another object of this invention to provide a method for the production of printed circuit boards in which undesired build-ups of electroless copper on the edges and borders of panels being plated is prevented.

The foregoing objects as well as additional objects which will be clear from the following description are achieved by the process of the invention now described.

Notably, the practice of this invention can result in a reduction in the cost of plating of up to 30 percent or more, due principally to savings on plating chemicals and acids and neutralizing bases needed to periodically etch copper away from plating tanks and other equipment surfaces. Additional savings are achieved due to avoidance of labor costs and lost production time necessitated by such etching procedures.

DESCRIPTION OF THE INVENTION

According to this invention, there is provided an improvement in a method for electrolessly depositing copper from an electroless copper deposition solution on a substrate, in which metallic equipment is in contact with the solution. The improvement comprises:

(1) initially imposing on the metallic equipment a potential more positive than the mixed potential of the electroless copper solution and sufficiently positive to render the equipment surface substantially resistant to electroless copper deposition;

(2) electrolessly depositing copper on said substrate from said electroless copper solution; and (3) while electrolessly depositing copper on said substrate, maintaining on the metallic equipment surface a potential more positive than said mixed potential and sufficiently positive to resist electroless copper deposition.

The described process can be applied to any type of metallic equipment used in electroless copper deposition operations, including plating vessels, racks supporting the substrate being plated, plumbing or any other piece of equipment in contact with the plating solution.

The foregoing process is practiced more specifically by initially imposing on the metallic equipment surface, e.g., plating vessel, rack, etc., a current sufficient to establish an electrical potential sufficiently positive to resist adherent electroless copper formation, electrolessly depositing copper on the substrate being plated, and adjusting the aforesaid applied current as the deposition reaction proceeds to maintain a sufficiently positive electrical potential on the metallic equipment surface, i.e., positive enough to resist electroless plating. Preferably, a current in the range between $10^{-4}$ and 4 milliamperes per square centimeter of surface area to be rendered resistant to electroless deposition is used.

By way of illustration, the procedure is carried out by providing at least one cathode in the electroless copper deposition solution and in electrical connection with the metallic equipment surfaces. A current is applied in the electrical connection between the cathode and metallic equipment surface sufficient to create an electrical potential on the equipment surface more positive than the mixed potential of the deposition solution and positive enough to resist formation of an adherent electroless copper deposit. This applied current is regulated during the electroless copper deposition to maintain the electrical potential on the metallic equipment surface sufficiently positive.

The terminology "mixed potential" herein is intended to mean that electrical potential at which copper begins to deposit electrolessly from an electroless copper solution onto a receptive surface with which it is in contact. Stated another way, it is the electrical potential measured between a substrate being plated with electroless copper and a standard reference electrode in electrical connection with the substrate being plated. Procedures for measuring the mixed potential of electroless copper solution are known in the art. One such procedure is described in the text hereinbelow immediately preceding the examples.

In general, electroless copper deposition solutions useful in this invention are characterized by a mixed potential within the range between $-500$ and $-800$ millivolts relative to a standard silver-silver chloride reference electrode, and in the range between $-550$ and $-850$ millivolts relative to a saturated calomel reference electrode, at the operating temperature of the deposition solution.

Typically, in carrying out electroless copper deposition procedures according to this invention, electrical potentials in the range between $-500$ and $+500$ millivolts, and more usually between $-300$ and $-100$ millivolts, relative to the reference electrode, are imposed and maintained on the metallic retaining walls of the plating vessel and/or on any other metallic plating equipment in contact with the bath. Such currents are sufficient to passivate equipment surfaces, as well as any copper already in contact therewith, e.g., precipitated copper, copper borders on panels being plated, and the like.

Using the principles described, this invention can be advantageously employed to passivate, i.e., render resistant to electroless copper, metallic racks supporting the substrate being plated in the deposition solution. Specifically, the rack is electrically connected to a terminal of a current source, e.g., a standard 200 ampere rectifier, and the other terminal of the current source is connected to a cathode suspended in the deposition solution. A current sufficient to establish a passivating electrical potential on the rack is supplied, copper is electrolessly deposited on the substratum supported on the rack, and during deposition the current is adjusted to maintain the rack in a passivated state. Although the rack can be passivated using the same current source as for the plating vessel or other plating equipment, it is preferred to use a separate power source for each piece of equipment being passivated.

The foregoing technique can be used, moreover, to prevent the electroless deposition of copper on undesired areas of the substratum. With particular reference to printed circuit board manufacture using additive techniques, in some cases the insulating panels which have been pre-cut to size, masked and sensitized, are left with an exposed sensitized border on the edges of the panel and the adjacent panel surface. When the panel is exposed to the deposition solution, copper begins to plate out on the sensitized panel edges and sensitized surface adjacent thereto to the same thickness as on the exposed areas of the panel corresponding to the desired circuit pattern. As a result, a continuous border of copper forms on the panel. In the typical case, this copper border, which is not part of the circuit pattern itself, is cut off from the rest of the panel and discarded. The build-up of this copper border can be prevented by contacting an edge of the panel with a metallic surface of the rack and supplying and maintaining enough current to the rack to passivate both the rack and the copper border on the panel.

Plating vessels as well as other metallic plating equipment used in the process of this invention can be cleaned of any copper precipitate which may cling to the surface, by temporarily stopping the plating operation, emptying the plating vessel and brushing, sweeping or vacuuming the copper away. Such cleaning may also be employed during the plating operation without emptying the plating vessel, as by vacuuming. It should be noted that, in contrast to the prior art, in the process of this invention copper does not adhere to the passivated equipment surfaces even after prolonged operation, and such copper can be easily removed by the foregoing cleaning procedures and without the need for etching or other harsh chemical or mechanical cleaning procedures.

In conducting the process of this invention, it will normally be found that a thin layer of electroless copper deposits on the cathode or cathodes. Copper deposition on the cathode surfaces can be completely or at least partially avoided by interposing between the cathode and electroless copper deposition solution a membrane permitting electrical conductivity between the cathode and deposition solution but preventing passage through of copper ions from a deposition solution.

Ion exchange membranes, either anionic or cationic, can be employed for this purpose. Selection of the particular ion exchange membrane will depend on the specific copper ion complexing agent employed in the bath. In cases where complexed copper possesses a negative charge, as where the complexing agent is of the amino acid type, cation exchange membranes are employed. An example of such a membrane is DuPont's Nafion. In those cases where the complexed copper possesses a positive charge, anion exchange membranes are employed. An example of such a membrane is RAI Research Inc.'s Permion 1020. If the complexed copper is neutral, as in the case when alkanolamine complexing agents are employed in the bath, either an anion or cationic exchange membrane may be employed.

The process of this invention is effective for use with plating vessels in which the retaining walls are made of nonnoble metals such as steel, iron, nickel, cobalt, copper, titanium, tantalum, chromium or the like. Similarly, the process can be used to render resistant to adherent electroless copper deposits other types of plating equipment made of such metals.

Electroless copper deposition solutions useful in this invention comprise, in general, copper ion, a complexing agent for the copper, a reducing agent or agents, and a suitable solvent, e.g., water. The copper ion may be supplied in the form of a copper salt, preferably water soluble, e.g., copper sulfate, copper chloride, copper nitrate, or the like.

The reducing agent is usually formaldehyde or a formaldehyde precursor, such as paraformaldehyde, trioxane and formaldehyde bisulfite, or formaldehyde derivative.

Complexing agents for copper ions are well known. In general, these are selected from among Rochelle salts, ethylenediaminetetraacetic acid (EDTA) or salts thereof, diethylenediaminepentaacetic acid, nitrilotriacetic acid, alkanolamines, gluconic acid, and the like. These are commercially available or can be prepared by following procedures described in the literature.

Other ingredients, such as stabilizers, ductility promoters, wetting agents, and the like, can also be included in the electroless copper deposition bath. The wetting agent is preferably employed in small amounts, e.g., less than 5 grams per liter. Commercially available examples are Pluronic P85, BASF-Wyandotte Corp., a block copolymer of ethylene oxide and propylene oxide, and Gafac RE 610, GAF Corp., an anionic phosphate ester.

Special mention is made of the electroless copper deposition solutions described in copending application Ser. No. 941,912, filed Sept. 13, 1978. These provide unusually fast rates of deposition with achievement of copper deposits of good quality which do not flake off from the substratum.

The pH of the copper deposition solution is usually at least 10, and preferably 11 or above. For pH adjustment, an alkali metal hydroxide, e.g., potassium hydroxide, sodium hydroxide, or the like, is typically employed.

The respective concentrations of the various ingredients in the electroless copper deposition solutions are subject to wide variation within the following preferred ranges:

| | |
|---|---|
| Copper salt | 0.002 to 1.20 mol |
| Reducing agent | 0.03 to 3 mols |
| Complexing agent | 0.05 to 20 times the mols of copper |
| pH adjustor | sufficient to give a pH of 10.0 to 14.0, preferably 11.0 to 14.0, measured at room temperature, e.g., 25° C. |
| Water | sufficient to make one liter |

The copper plating solutions may be compounded within more narrow limits as follows:

| | |
|---|---|
| Soluble cupric salt, preferably cupric sulfate or cupric chloride | 0.002 to 0.4 mol |
| Formaldehyde or formaldehyde precursor | 0.06 to 0.50 mol |
| Cupric ion complexing agent, as described | 0.5 to 2.0 times the mols of copper |
| Alkali metal hydroxide, preferably sodium hydroxide | sufficient to give pH 11.2 to 13.9, at room temperature, e.g., 25° C. |
| Water | sufficient to make one liter |

Concentrated versions of the foregoing can be manufactured for subsequent dilution to the operating solutions described herein.

In the typical case, the substratum to be metallized, if initially non-receptive to electroless deposition, is treated conventionally to render it receptive to electroless copper from an electroless copper deposition solution. With reference to the plating of plastics in general and the manufacture of printed circuit boards in particular, this is done by contacting the surface areas to receive the deposit with a sensitizing/seeding solution, for example, stannous chloride ($SnCl_2$), followed by dilute palladium chloride ($PdCl_2$), or alternatively, by contacting with a dilute acidic solution prepared from palladium chloride and excess stannous chloride.

In the manufacture of printed circuit boards using additive or semi-additive procedures, to obtain enhanced adhesion of the electroless metal layer to the substratum a layer of adhesive which includes finely divided particles of an oxidizable or degradable rubber is provided on the surface of the insulating substratum. The adherent resinous layer is normally present in a thickness, when dry, of about 20 to 30 microns or more. Such resinous layers can comprise, for example, an epoxy resin, a phenolformaldehyde condensation product, a nitrile rubber in a curable composition, melamine, polyacrylic, polyester, natural rubber or curable polystyrene resin, and the like, applied to the insulating substratum in a partially hardened state, as by transfer coating, and then cured. The adherent resinous layer is preferably pretreated with a strong oxidizing agent such as chromosulfuric acid, i.e., Cr(VI) in sulfuric acid, or a permanganate solution. Such articles are described in U.S. Pat. No. 3,625,758, incorporated herein by reference.

On the other hand, the insulating substratum can be catalytic throughout its entire mass to the deposition of electroless metal, such as by a uniform dispersion therein of a catalytic filler, e.g., as shown in U.S. Pat. No. 3,629,185, incorporated herein by reference. When through holes are drilled or punched in the insulating substratum for purposes of forming circuit interconnections, the walls of the through holes, containing exposed catalytic material, do not need to be sensitized.

Following the foregoing pretreatments, the substratum to be plated is immersed in or otherwise exposed to the electroless copper deposition bath and plating is carried out in accordance with the process of the invention.

DETAILED DESCRIPTION OF THE DRAWINGS

Figure 1:
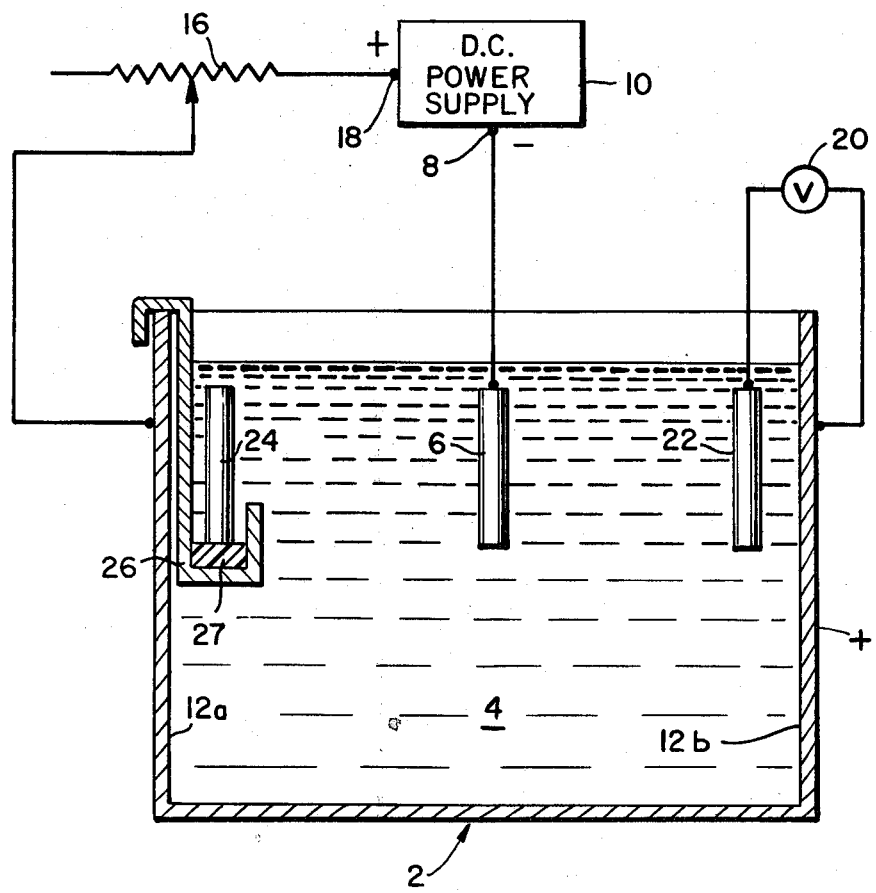
FIG. 1 illustrates a simplified plating system which can be used to practice this invention, comprising a plating tank with metallic retaining walls, plating solution, power source, electrodes, substratum to be plated and support means.

With respect to FIG. 1, plating tank 2, the retaining walls of which are made of steel, preferably stainless steel, or other suitable electrically conductive material, contains electroless copper plating solution 4. Metal probe 6 is immersed in plating solution 4 and electrically connected to negative terminal 8 of direct current power supply unit 10. Surface 12 of tank 2 is electrically connected through variable resistor 16, to positive terminal 18 of power supply unit 10. Retaining wall 12 of tank 2 is also connected to millivoltmeter 20 and to standard reference electrode 22. Reference electrode 22 is in communication with plating solution 4. Workpiece 24 is supported on metal rack 26. Rack 26, in electrical contact with surface 12a of tank 2, is suspended in plating solution 4. Workpiece 24 is electrically insulated from rack 26 by nonconductor (insulator) 27.

In practice, an electrolytic couple comprising surface 12 (12a and 12b) of tank 2 and probe 6 is formed by connecting these to the opposite terminals of power supply unit 10, as shown. Preferably before starting plating solution 4 (e.g., by adding reducing agent, or by raising pH or temperature), a potential more positive than the expected mixed potential of the started plating solution is applied to surfaces 12a and 12b of tank 2 by adjusting resistor 16 as needed. Plating solution 4 formulation and conditions are adjusted by known means to start electroless plating (e.g., by adding the reducing agent, raising the pH, raising the temperature). Workpiece 24 is immersed in plating solution 4, and plating begins. The electrical potential of surface 12 with respect to reference electrode 22 is monitored during plating by observing millivoltmeter 20, and this potential is maintained more positive than the mixed potential of plating solution 4. The electrical potential of the plating equipment surfaces can be regulated manually, as in the embodiment shown in FIG. 1, or automatically, as desired. A system in which the electrical potential is controlled automatically is illustrated in FIG. 2.

Figure 2:
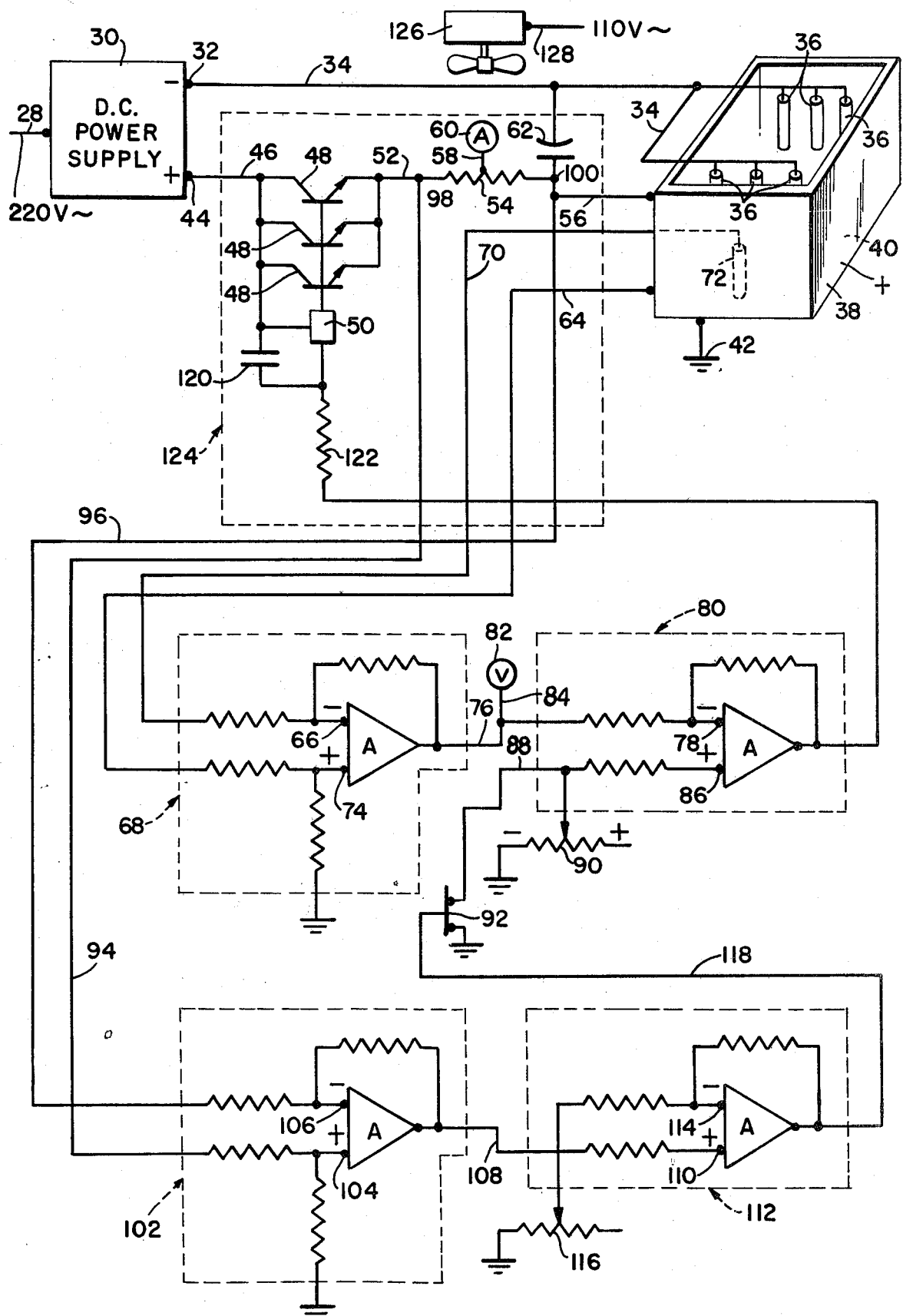
FIG. 2 shows a more detailed system, adapted for automatic control, which is useful in the practice of this invention.

With reference to FIG. 2, 220-volt alternating current line 28 extends to direct current supply unit 30, which is capable of generating one hundred amperes of current at seven volts. Negative terminal 32 of power supply unit 30 is electrically connected by line 34 to metal probes 36, which are suspended in metal tank 38. Tank 38 contains plating solution 40 and is grounded by grounding wire 42. Positive terminal 44 of power supply unit 30 is electrically connected by line 46 to pass transistors 48, which are in parallel and driven by Darlington power transistor 50. Each of pass transistors 48 preferably has an output capacity of fifty amperes. Darlington power transistor 50 is preferably set for a gain of about ten thousand:one.

Pass transistors 48 are connected by electrical line 52, meter shunt 54, and electrical line 56 to tank 38. Meter shunt 54 is connected by line 58 to standard ammeter 60, which measures the current from pass transistors 48 across meter shunt 54. Capacitor 62, preferably having a capacitance of two microfarads, is connected across electrical line 34 and meter shunt 54 to reduce background electrical noise.

Electrical line 64 extends from tank 38, and is connected to positive terminal 74 of voltage amplifier 68. Electrical line 70 extends from standard reference electrode 72, and is connected to negative terminal 66 of amplifier 68. Amplifier 68 is set for a gain of ten:one. Reference electrode 72 is a conventional silver/silver chloride electrode, or equivalent reference electrode, in salt bridge communication with plating solution 40 in tank 38.

Amplifier 68 is connected by electrical line 76 to negative terminal 78 of control amplifier 80. The voltage output from amplifier 68 to amplifier 80 is measured across standard voltmeter 82, connected by line 84 to line 76. Positive terminal 86 of control amplifier 80 is connected by line 88 to potentiometer (set point) 90, and to FET switch 92. Potentiometer 90 preferably has a maximum possible setting of from 3 volts positive to 2 volts negative.

Electrical lines 94 and 96 extend from terminals 98 and 100, respectively, of meter shunt 54, to voltage amplifier 102. Line 94 is connected to positive input terminal 104 of amplifier 102. Line 96 is connected to negative input terminal 106 of amplifier 102. The voltage output from amplifier 102 goes through line 108 to positive input terminal 110 of control amplifier 112. Amplifier 112 is set for a gain of twenty:one. Negative input terminal 114 of control amplifier 112 is connected to potentiometer (set point) 116. Electrical line 118 runs from amplifier 112 to FET switch 92.

Capacitor 120, preferably having a capacitance of one microfarad, and resistor 122 preferably having a resistance of one ohm, are included in the circuit for purposes of background noise reduction.

Preferably, to prevent overheating, pass transistors 48, power transistor 50, capacitors 120 and 62, resistor 122 and ammeter 60 are situated on heat sink 124 (indicated by dotted lines), and cooled by fan 126 connected to 110-volt alternating current line 128. Heat sink 124 is made of aluminum or other standard heat absorptive material.

In practice, the process of this invention is carried out as follows:

With reference to FIG. 2, alternating current from 220-volt line 28 is converted to direct current in D.C. power supply unit 30. Negative potential from power supply unit 30 is applied to electrodes 36 in tank 38. Electrodes 36 are thus made cathodic. Positive potential from power supply unit 30 is sent through power transistor 50, pass transistors 48, line 52, meter shunt 54, and line 56 to tank 38. Tank 38 is thus then made anodic. The current across meter shunt 54 is monitored by use of ammeter 60.

A silver/silver chloride reference electrode 72 is suspended in tank 38 and kept in communication with plating solution 40 in conventional manner by means of a porous membrane therebetween. By connecting reference electrode 72 and tank 38 to the opposite terminals of amplifier 68, in the manner shown, the potential (voltage) of the walls of tank 38 is thus continuously monitored, and moreover, controlled as follows:

If the voltage from amplifier 68 to control amplifier 80 is predominantly positive, amplifier 80 tends to turn out a positive voltage. If, on the other hand, the voltage from amplifier 68 to control amplifier 80 is predominantly negative, amplifier 80 tends to turn out a negative voltage. A positive voltage to power transistor 50 causes the latter to generate current flow. A negative voltage to power transistor 50 causes the latter to shut off and substantially all current flow to cease. During plating, as the potential (voltage) of tank 38 becomes less negative (i.e., more positive) with respect to reference electrode 72, amplifier 68 applies a positive voltage to control amplifier 80, which, in turn, applies a negative voltage to power transistor 50. By adjusting set point 90, the positive voltage output of control amplifier 80 is regulated as needed to establish the overall output of amplifier 80 and to achieve the desired current flow to tank 38 as needed to maintain the potential (voltage) of tank 38 to the set potential which is more positive than the mixed potential of solution 40.

Excess current is prevented from flowing to tank 38 by means of voltage amplifier 102 and control amplifier 112. The potential (voltage) across meter shunt 54 is directly proportional to the current flow from power transistor 50 and pass transistors 48. This voltage is boosted in amplifier 102 and further amplified in control amplifier 112. If the amplified voltage from amplifier 112 to the gate of FET 92 rises above the cut-off point, FET switch 92 opens, voltage dividing the output of potentiometer 90 reducing the set point of amplifier 80, thus returning the system to equilibrium.

The output of amplifier 102 is balanced by the output of potentiometer 116 which establishes the set point of amplifier 112. Adjusting 116 determines the maximum current allowed before reducing the set point of control amplifier 80. The function of amplifiers 102 and 112 is to limit the maximum current applied to the tank and cathodes to protect the total system.

In the foregoing manner, the voltage applied to tank 38 is maintained more positive than the known mixed potential of plating solution 40, and substantially no metal deposits on the walls of tank 38.

In the specific procedure described above, metallic racks can be used support the substrates being plated and such racks can be rendered resistant to electroless copper deposition using the principles described. In such cases, it is desirable to employ a separate control circuit for supplying current to the racks. If the substrates supported on the racks and being plated are panels having copper borders, a larger current supply will be required to hold the passivating electrical potential on the racks (and copper borders on the panel). If, on the other hand, it is desired to plate the entire substrate or if the copper borders on the panel form part of or are in interconnection with the circuit pattern, it is preferred to insulate the substrate from the rack by interposition of a substantially electrically non-conductive material (See FIG. 1). The metal racks as well as any metal fasteners will, of course, still be resistant to electroless plating.

Figure 3:
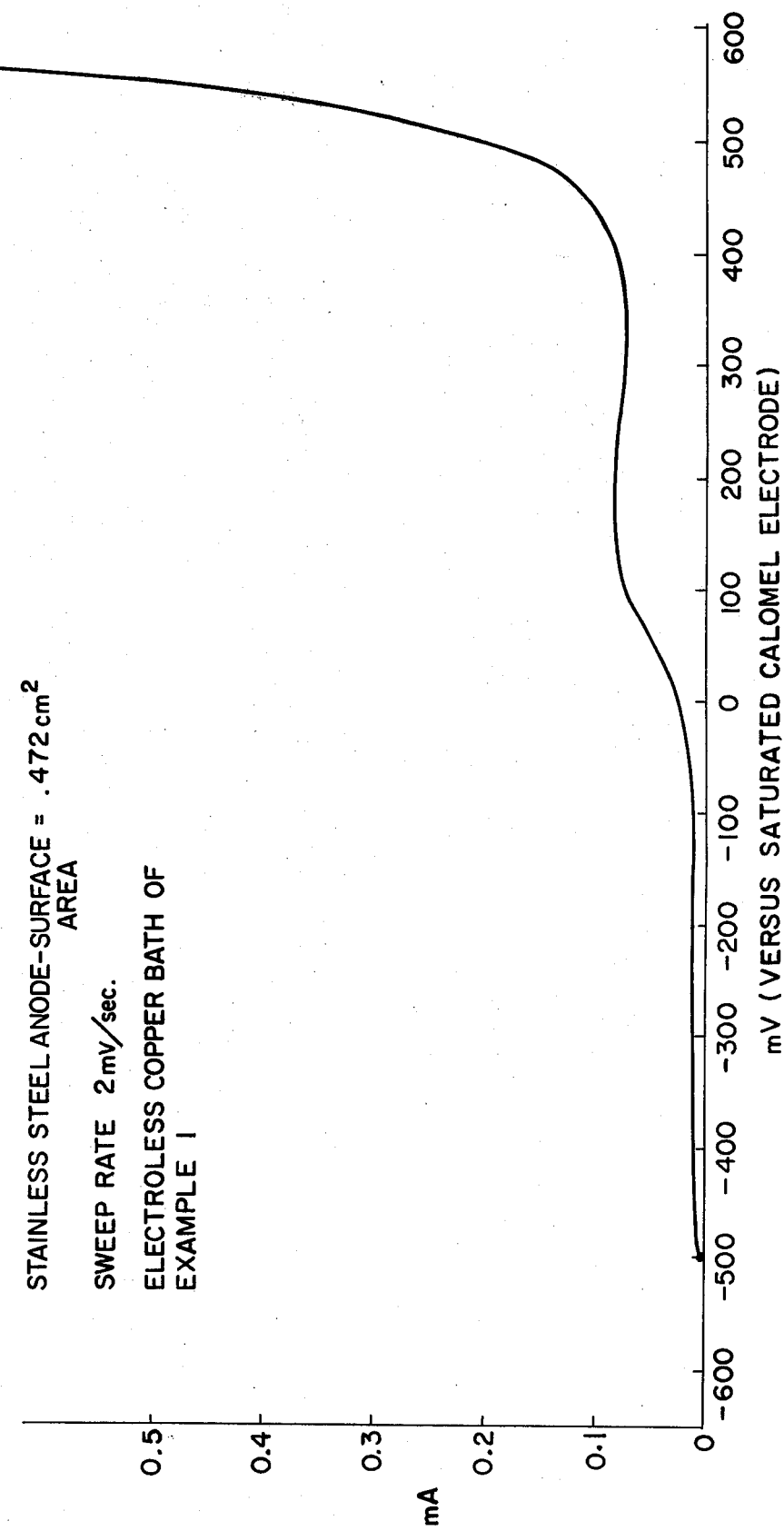
FIG. 3 is a graph showing the current as a function of potential (voltage) for stainless steel in an electroless copper deposition solution.
Figure 4:
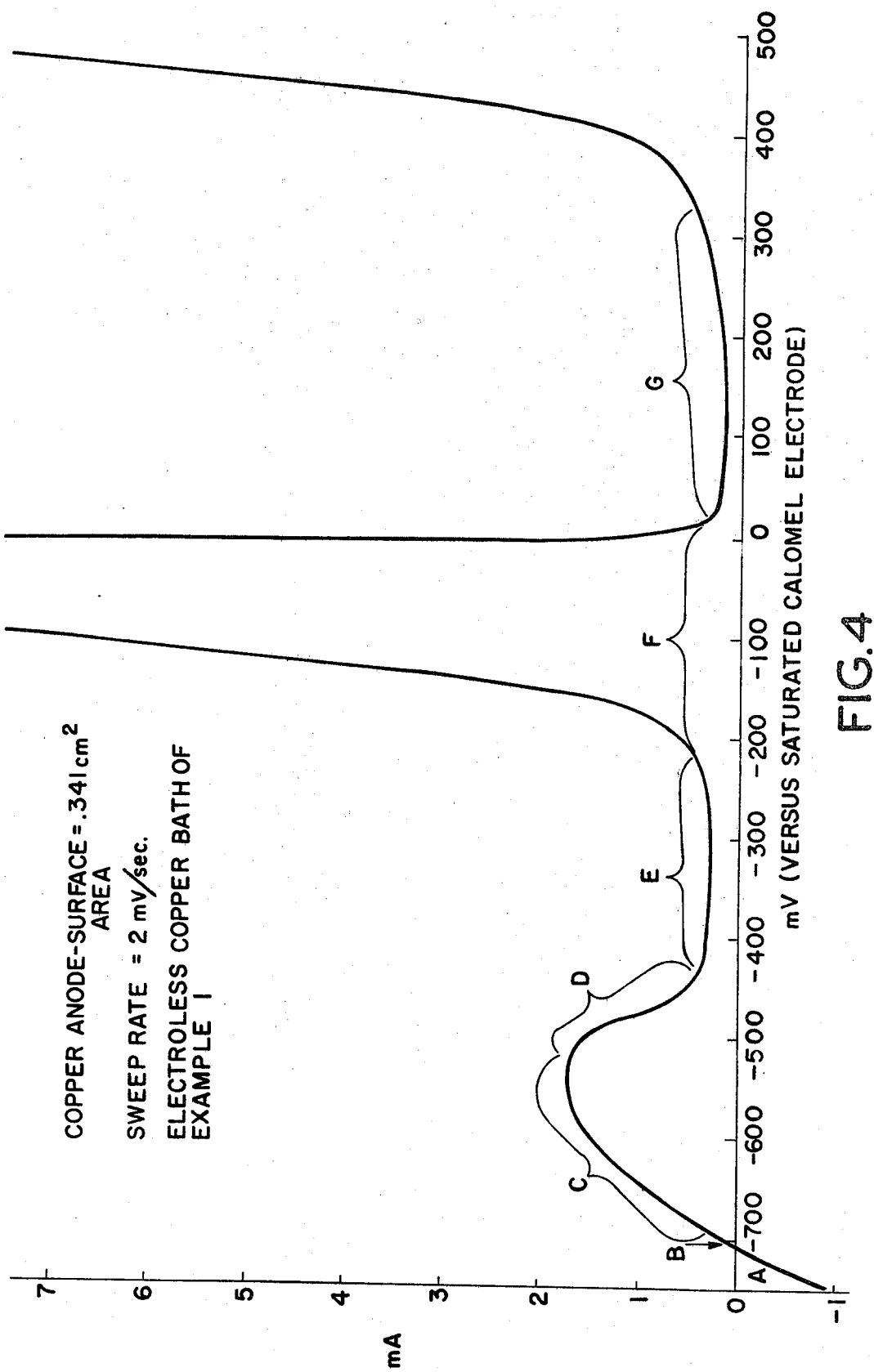
FIG. 4 is a graph showing the current as a function of potential (voltage) for copper in an electroless copper deposition solution of the same formulation as in FIG. 3.

FIGS. 3 and 4 show the current as a function of the voltage for copper and stainless steel in an electroless solution having the same compositions of Example 1. Positive currents are oxidizing currents and negative currents are reducing, i.e., plating, currents. At point "B" in FIG. 4 (copper electrode), there is no net current flow, so this potential is the mixed potential of the deposition solution. In region "A", more copper ions are being reduced than formaldehyde is being oxidized, so there is a net negative (plating) current. In region "C", more formaldehyde is being oxidized than copper ions reduced, so there is a net positive (oxidizing) current. In region "D", a film forms on the surface of the copper electrode that is non-catalytic to the oxidation of formaldehyde, so the current decreases. The maximum current required to passivate is 4 milliamps per square centimeter. Copper ion reduction does not occur at potentials more positive than about −450 millivolts (mV) relative to the reference electrode, or 250 millivolts more positive than the mixed potential. Region "E", extending from about −425 to −225 mV, is the passivation range. In this region, the potential is too anodic to reduce copper ions and the electrode surface is non-catalytic to the oxidation of formaldehyde, so there is little current flow. Since the current in this region is about the same for the solution without formaldehyde as for the solution with it, most of the current flowing in this region is not due to the oxidation of formaldehyde. Some copper oxidation may occur in this region. The current flowing in region "F" is due to the oxidation and partial dissolution of the electrode surface. Region "G" is a second passivation region. Beyond region "G" several things could oxidize—$OH^-$ ions, EDTA, copper or formaldehyde.

FIG. 3 shows that a stainless steel electrode is relatively passive from −500 to +400 mV. At potentials more negative than −500 mV copper would begin to plate on the stainless steel, altering its characteristics. At −325 mV the current density is 40 times less for stainless steel than for copper (0.020 vs. 0.80 mA per $cm^2$). Stainless steel is very slow to initiate plating in an electroless copper bath. This is because it is an extremely poor catalyst for the oxidation of formaldehyde. However, once plating initiates it can proceed rapidly because the copper can then catalyze the formaldehyde oxidation.

A potential of about −325 mV (versus the saturated calomel electrode) is best for passivation of both stainless steel and copper since it is in the middle of the copper passivation range and the stainless steel current density is very low.

The passivation range can shift slightly as the pH changes. The shift is in the same direction as the solution mixed potential with pH changes, and is of similar magnitude. Thus, a mixed potential probe for the reference electrode could work very well.

In FIGS. 3 and 4, the values for potentials were measured using a model 174A Polarographic Analyzer (Princeton Applied Research) and the reference for all runs was a saturated calomel electrode. The current was monitored as the potential was scanned under an air atmosphere and recorded on a PAR X-Y Recorder.

MEASUREMENT OF MIXED POTENTIAL

Place a clean copper surface in the electroless metal deposition solution—metal will begin to deposit on the copper surface. Allow 3–4 minutes to permit a steady state to be attained. Connect the copper surface to one terminal of a high impedance millivoltmeter, such as a standard pH-meter. Connect a standard reference electrode immersed in the bath to the other terminal of the high impedance millivoltmeter. Measure the difference in potential (voltage) between the copper surface and the reference electrode. This is the mixed potential of the copper deposition solution, i.e., the potential at which copper deposits from the solution.

DESCRIPTION OF THE SPECIFIC EMBODIMENTS

The invention is illustrated in the following examples, which are not intended to be limiting.

EXAMPLE 1

An article useful in the manufacture of printed circuit boards is prepared for metallization in accordance with this invention as follows:

(a) Take a clean epoxy-glass laminate (SYNTHANE FB 620, Taylor Corporation), having a thickness of 1.6 millimeters: coat the top and bottom surfaces with the following composition:

| | | |
|---|---|---|
| Methyl ethyl ketone | 415 | grams |
| Cellosolve acetate | 2,375 | grams |
| Nitrile rubber liquid | 590 | grams |
| Nitrile rubber, in lumps | 350 | grams |
| Oil soluble phenol resin, thermal-setting | 350 | grams |
| Epoxy resin (epichlorohydrin) derivative | 400 | grams |
| $SiO_2$, finely divided | 300 | grams |
| Butyl carbitol | 1,830 | grams |
| Viscosity about 600 cps. at 22° C. | | |

Apply enough adhesive to achieve an adhesive layer thickness, when dry, of 25 micrometers.

(b) Air dry for several minutes, and heat at 160° C. for 30–90 minutes to harden adhesive layer.

(c) Drill laminate with multiple through holes, each hole having a diameter of one millimeter.

(d) Promote bonding sites by contacting adhesive layer for 15 minutes with a solution having the following composition:

| | | |
|---|---|---|
| Chromic acid ($CrO_3$) | 100 | grams |
| Concentrated sulfuric acid ($H_2SO_4$) | 500 | grams |
| Water (to make) | 1,000 | milliliters |

(e) Rinse briefly with water.

(f) Neutralize surface by immersing for several minutes in an aqueous solution comprising 1% sodium bisulfite ($Na_2S_2O_5$).

(g) Immerse workpiece for several minutes in cold running water.

(h) Sensitize adhesive surface and through holes to electroless copper deposition by contacting for 5 minutes with OXYTRON Activator 316, a palladium chloride/tin chloride sensitizing solution commercially available from Sel-Rex Co. of OMF Corp., Nutley, N.J.

(i) Rinse sensitized surface briefly with water.

(j) Contact for 5 minutes with an aqueous solution comprising 5% fluoboric acid by volume, to remove excess tin salt.

(k) Rinse briefly with water.

(l) Air dry.

(m) Selectively mask areas of adhesive layer not corresponding to desired circuit patterns with RISTON ®, a dry film acrylate photoresist available from DuPont. The through holes and areas of the adhesive surface corresponding to the desired circuit pattern should be left unmasked and exposed.

The laminate is now ready for electroless metal deposition in accordance with this invention as follows:

The electroless copper deposition solution has the following composition and is operated at 72° C.:

| | |
|---|---|
| $CuSO_4.5H_2O$ | 10 grams/liter |
| formaldehyde | 4 milliliters/liter |
| wetting agent | 0.2 gram/liter |
| tetra-sodium salt of EDTA | 35 grams/liter |
| sodium hydroxide (NaOH) | to pH 11.7 (as measured at 25° C.) |
| Sodium cyanide (NaCN) | 0.005 gram/liter |
| water | to volume |

The copper deposition solution has a mixed potential of $-630 \pm 20$ millivolts, measured with reference to a standard silver/silver chloride electrode.

All of the ingredients of the foregoing deposition solution except the formaldehyde are mixed together in a stainless steel plating vessel. A stainless steel cathode is immersed in the solution and connected to the negative terminal of a variable d.c. rectifier having a maximum capacity of 8 volts, 100 amperes. A standard silver/silver chloride reference electrode is immersed in the deposition solution and connected to one side of a millivoltmeter outside the solution. The other side of the millivoltmeter is connected to a wall of the stainless steel vessel.

The electrical potential on the plating vessel wall relative to the reference electrode is adjusted to $-200$ millivolts by regulating the rectifier. The electroless copper solution is started up by adding the formaldehyde. The epoxy-glass laminate, which has been pretreated and sensitized as described and is supported on a stainless steel rack, is immersed in the electroless copper solution. Copper begins to deposit electrolessly on the laminate. After 10 hours or a copper deposit of 20 micrometers has been achieved, the laminate is taken from the deposition solution. It is observed that during the electroless plating reaction, substantially no electroless copper has been deposited on the stainless steel vessel surfaces or stainless steel rack in contact with the electroless copper deposition solution.

EXAMPLE 2

The procedure of Example 1 is repeated, except that an electroless copper deposition solution having the following composition is used:

| | |
|---|---|
| Cupric chloride | 9.5 grams/liter |
| Tetrasodium salt of EDTA | 35 grams/liter |
| Wetting agent | 0.2 gram/liter |
| Sodium cyanide (NaCN) | 0.004 gram/liter |
| Formaldehyde (37%) | 3.3 milliliters/liter |
| Sodium hydroxide (NaOH) | to pH 11.6 (as measured at 25° C.) |
| Water | to volume |
| Temperature | 72° C. |
| Mixed potential | $-610$ millivolts |

Substantially the same results are obtained.

EXAMPLE 3

This example illustrated the use of a two electrode system, i.e., operated without a reference electrode in a process according to this invention.

An electroless copper solution having the same composition as in Example 1 is placed in a vessel having stainless steel retaining walls. The vessel has a capacity of 8,000 liters and an internal surface area of about 60 square meters.

The rectifier is adjusted to obtain a potential of 0.45 volt between the stainless steel cathode immersed in the deposition solution and the stainless steel walls of the vessel. After this adjustment, it is observed that the walls of the vessel have a potential of from $-300$ to $-400$ millivolts, relative to the silver/silver chloride reference electrode. After this initial measurement, the reference electrode is disconnected and removed. The initial current needed to achieve 0.45 volt between the vessel walls and steel cathode is 0.5 ampere, equivalent to a current density of $10^{-4}$ milliamperes per square centimeter.

Six stainless steel racks, containing 300 substrates per rack, are placed in the electroless copper solution. These are removed at intervals of 18 to 22 hours, to replace the plated substrates with fresh substrates to be plated. During the first 24 hours of plating operation, as plated substrates are removed and new substrates are introduced into the solution, it is observed that a precipitate comprising metallic copper forms in the solution. Some of this precipitate comes into contact with the surfaces of the plating vessel. The current needed to maintain 0.45 volt between the vessel surfaces and steel cathode rises. Over the next several days of operation, it is observed that the current required to maintain 0.45 volt rises and falls in the range of from 2 to 100 amperes as further metallic copper precipitates, comes into contact with the vessel surfaces and is passivated.

At the end of about one week, the plating operation is interrupted. The copper precipitate in contact with the interior surfaces of the vessel consists of passivated non-adherent particles which are easily removed by sweeping with a brush.

The invention in its broadest aspects is not limited to the specific steps, procedures and materials described. It is to be understood, therefore, that departures may be made from the specific embodiments described while keeping within the scope of the accompanying claims and without departing from the principles of the invention or without sacrificing its chief advantages.

I claim:

1. In a method for electrolessly depositing copper from an electroless copper deposition solution of known mixed potential on at least one substrate sensitive to such deposition, the improvement for rendering the metallic surfaces of plating equipment in contact with the solution substantially resistant to electroless copper deposition, comprising:

(1) initially imposing on said metallic plating equipment surfaces an electrical potential more positive than the mixed potential of the electroless copper solution but not substantially more positive than required to render said equipment surfaces substantially resistant to electroless copper deposition;

(2) electroless depositing copper on said substrate from said electroless copper solution; and (3) while electrolessly depositing copper on said substrate, adjusting said more positive electrical potential to maintain said more positive electrical potential sufficiently positive to resist electroless copper deposition.

2. The method of claim 1, in which the electroless copper solution has a mixed potential in the range between $-500$ and $-800$ millivolts relative to a standard silver-silver chloride reference electrode and in the range between $-550$ and $-850$ millivolts relative to a saturated calomel reference electrode.

3. The method of claim 2, in which the electrical potential imposed and maintained on said metallic equipment surfaces is in the range between $-500$ and $+500$ millivolts relative to said reference electrode, and more positive than said mixed potential.

4. The method of claim 3, in which said electrical potential is in the range between $-300$ and $-100$ millivolts, relative to said reference electrode.

5. The method of claim 2, in which the electrical potential imposed and maintained on said metallic equipment surfaces is at least about 250 millivolts more positive than said mixed potential.

6. The method of claim 1, in which said plating equipment comprises a plating vessel having metallic retaining walls in which the deposition solution is contained.

7. The method of claim 1, in which said plating equipment comprises a rack supporting the substrate being plated in the deposition solution, said rack being constructed wholly or in part of metal.

8. The methods of claims 6 or 7, in which said equipment metal is steel.

9. The methods of claims 6 or 7, in which said equipment is stainless steel.

10. A method for electrolessly depositing copper from a deposition solution of known mixed potential on a substrate sensitive to said deposition, comprising:

(1) initially imposing an electrical current on the metallic surfaces of plating equipment in contact with the solution, said current being sufficient to provide an electrical potential on said equipment surfaces more positive than the mixed potential of the solution but not substantially more positive than required to render the equipment surfaces substantially resistant to formation of an adherent electroless copper deposit;

(2) electrolessly depositing copper on said substrate from said electroless copper solution; and (3) while electrolessly depositing copper on said substrate, adjusting said current imposed on said equipment surfaces to maintain such electrical potential more positive than said mixed potential but not substantially more positive than required to resist electroless copper deposition thereon.

11. The method of claim 10, in which the electrical potential imposed and maintained on said metallic equipment surfaces is in the range between $-500$ and $+500$ millivolts, relative to a standard silver-silver chloride reference electrode or saturated calomel reference electrode, and more positive than said mixed potential.

12. The method of claim 11, in which said electrical potential is in the range between $-300$ and $-100$ millivolts, relative to said reference electrode.

13. The method of claim 11, in which said electrical potential is at least 250 millivolts more positive than said mixed potential.

14. The method of claim 10, in which said current is in the range between $10^{-4}$ to 4 milliamps per square centimeter of surface area to be rendered resistant to said electroless copper deposition.

15. The method of claim 10, in which said equipment surfaces are comprised of stainless steel.

16. The method of claim 10, in which said plating equipment comprises a plating vessel having stainless steel retaining walls, at least one rack made wholly or in part of stainless steel, or both of the foregoing.

17. The method of claim 10, in which the electroless copper deposition solution comprises copper ion, a complexing agent for copper ion and a reducing agent.

18. The method of claim 10, in which the substrate being plated comprises an insulating material useful in the manufacture of printed circuit boards.

19. In a method for the production of printed circuit boards by electrolessly depositing copper on a substrate from a solution comprising copper ion, a complexing agent for copper ion and formaldehyde, while said solution is contained in a vessel having stainless steel retaining walls and said substrate is supported in said solution on a rack comprising stainless steel, the improvement comprising:

(1) providing at least one cathode in the electroless copper solution and in electrical connection with said retaining walls and rack;

(2) initially imposing a current in said electrical connection, said current being sufficient to establish an electrical potential on said retaining walls and rack more positive than the mixed potential of said electroless copper solution but not substantially more positive than required to resist formation thereon of an electroless copper deposition from said solution;

(3) electrolessly depositing copper on said substrate from said electroless copper solution; and (4) while electrolessly depositing copper on said substrate, regulating said current imposed on said electrical connection to maintain said more positive electrical potential more positive than said mixed potential but not substantially more positive than required to resist formation thereon of an electroless copper deposit.

20. The process of claim 19, in which the electroless copper solution has a mixed potential in the range between $-500$ and $-800$ millivolts relative to a standard silver-silver chloride reference electrode, and in the range between $-550$ and $-850$ millivolts relative to a saturated calomel reference electrode.

21. The method of claim 20, in which the electrical potential imposed and maintained on the retaining walls and rack is in the range between $-500$ and $+500$ millivolts, relative to said reference electrode.

22. The method of claim 21, in which said electrical potential is in the range between $-300$ and $-100$ millivolts relative to said reference electrode.

23. The method of claim 21, in which said electrical potential is at least 250 millivolts more positive than said mixed potential.

24. The method of claim 19, in which said current is in the range between $10^{-4}$ to 4 milliamps per square centimeter of surface area to be rendered resistant to said electroless copper deposition.

25. A method for rendering a steel surface in contact with metallic copper substantially resistant to electroless copper deposition from a solution in contact therewith, comprising:
(1) initially imposing an electrical current on said steel surface sufficient to provide an electrical potential thereon more positive than the mixed potential of said solution but not substantially more positive than required to render said surface substantially resistant to electroless copper deposition from said solution;
(2) electrolessly depositing copper from said solution on a substrate immersed therein; and
(3) while said electroless copper deposition is taking place, adjusting said current imposed on said steel surface to maintain the electrical potential thereon more positive than said mixed potential but not substantially more positive than required to resist formation thereon of an adherent electroless copper deposit.

* * * * *